(12) United States Patent
Okada et al.

(10) Patent No.: US 8,248,172 B2
(45) Date of Patent: Aug. 21, 2012

(54) WIDEBAND OSCILLATION CIRCUIT

(75) Inventors: Kenichi Okada, Ota-ku (JP); Shoichi Hara, Hadono (JP)

(73) Assignee: Semiconductor Technology Academic Research Center, Yokohama-shi, Kanagawa (JP)

( * ) Notice: Subject to any disclaimer, the term of this patent is extended or adjusted under 35 U.S.C. 154(b) by 0 days.

(21) Appl. No.: 13/019,032

(22) Filed: Feb. 1, 2011

(65) Prior Publication Data

US 2011/0187469 A1  Aug. 4, 2011

(30) Foreign Application Priority Data

Feb. 2, 2010  (JP) ................................. 2010-021335

(51) Int. Cl.
*H03L 7/00* (2006.01)
(52) U.S. Cl. .................. 331/57; 331/2; 331/46; 331/34; 331/16; 327/156; 327/159
(58) Field of Classification Search .................... 331/57, 331/16, 34, 2, 46; 455/260
See application file for complete search history.

(56) References Cited

U.S. PATENT DOCUMENTS

| | | | | |
|---|---|---|---|---|
| 4,746,873 A | * | 5/1988 | Cowley | .......................... 329/318 |
| 5,172,357 A | | 12/1992 | Taguchi | |
| 7,961,057 B2 | * | 6/2011 | Ong et al. | ........................ 331/51 |

FOREIGN PATENT DOCUMENTS

| | | |
|---|---|---|
| JP | 03-189966 | 8/1991 |
| JP | 2009-225438 | 10/2009 |

OTHER PUBLICATIONS

Hara et al. "A 9.3 MHZ to 5.7 GHz Tunable LC-based VCO Using a Divide—by-N Injection-Locked Frequency Divider." *IEEE A-SSCC*. Nov. 2009. 4 pages.
Razavi. "Multi-decade Generation for Cognitive Radios." *Symposium on VLSI Circuits Digest of Technical Papers*. 2009. pp. 120-121.
Nuzzo et al. "A 0.1-5GHz Dual-VCO Software-Defined ΣΔ Frequency Synthesizer in 45nm Digital CMOS." *IEEE Radio Frequency Integrated Circuits Symposium*. 2009. pp. 321-324.
Ito et al. "A 0.98 to 6.6GHz Tunable Wideband VCO in a 180nm CMOS Technology for Reconfigurable Radio Transceiver." *IEEE Asian Solid-State Circuits Conference*. 2006. pp. 359-362.
Japanese Office Action from JP 2010-021335 dated Jan. 31, 2012.

* cited by examiner

*Primary Examiner* — Arnold Kinkead
(74) *Attorney, Agent, or Firm* — Merchant & Gould P.C.

(57) ABSTRACT

A wideband oscillation circuit outputting oscillation signals (divided signals) of continuous frequencies is disclosed and the wideband oscillation circuit includes an oscillator that outputs an oscillation signal, a filter that filters the oscillation signal output from the oscillator and outputs an injection locked signal, and an injection locked frequency divider that performs a free-run operation and outputs a divided signal of the oscillation signal while its oscillating operation is regulated by the injection locked signal, the division ratio of which varies in accordance with a control signal, wherein the filter generates the injection locked signal by controlling the passing characteristic that caused the oscillation signal to pass with respect to time in accordance with a filter control signal locked with the divided signal.

4 Claims, 19 Drawing Sheets

| | | | | | | | | | | | | | | | | |
|---|---|---|---|---|---|---|---|---|---|---|---|---|---|---|---|---|
| DIVIDED BY 2 | 0 | | <u>10</u> | | 20 | | <u>30</u> | | 40 | | <u>50</u> | | 60 | | | |
| 3 | 0 | | <u>7</u> | 13 | | <u>20</u> | 27 | | <u>33</u> | 40 | | <u>47</u> | 53 | | <u>60</u> | |
| 4 | 0 | <u>5</u> | 10 | <u>15</u> | 20 | <u>25</u> | 30 | <u>35</u> | 40 | <u>45</u> | 50 | <u>55</u> | 60 | | | |
| 5 | 0 | <u>4</u> | 8 | 12 | 16 | <u>20</u> | 24 | <u>28</u> | 32 | 36 | <u>40</u> | 44 | <u>48</u> | <u>52</u> | 56 | <u>60</u> |
| 6 | 0 | <u>3</u> | 7 | <u>10</u> | 13 | 17 | 20 | 23 | 27 | <u>30</u> | 33 | <u>37</u> | 40 | 43 | 47 <u>50</u> 53 57 <u>60</u> | |
| 4/3 | 0 | | | <u>15</u> | | | 30 | | | <u>45</u> | | | 60 | | | |
| 3/2 | 0 | | | 13 | | | 27 | | | <u>40</u> | | | 53 | | | |
| 5/2 | 0 | | <u>8</u> | | 16 | | <u>24</u> | | 32 | | <u>40</u> | | 48 | | <u>56</u> | |

FIG.12

| DIVIDED BY | (A) | (B) | (C) |
|---|---|---|---|
| 2 | POSSIBLE | POSSIBLE | NOT POSSIBLE |
| 3 | POSSIBLE | NOT POSSIBLE | NOT POSSIBLE |
| 4 | POSSIBLE | NOT POSSIBLE | POSSIBLE |
| 5 | POSSIBLE | NOT POSSIBLE | NOT POSSIBLE |
| 6 | POSSIBLE | POSSIBLE | NOT POSSIBLE |
| 4/3 | POSSIBLE | NOT POSSIBLE | NOT POSSIBLE |
| 3/2 | POSSIBLE | NOT POSSIBLE | NOT POSSIBLE |
| 5/2 | POSSIBLE | NOT POSSIBLE | NOT POSSIBLE |

WIDEBAND OSCILLATION CIRCUIT

This application claims benefit of Serial No. 2010-021335, filed 2 Feb. 2010 in Japan and which application(s) are incorporated herein by reference. To the extent appropriate, a claim of priority is made to each of the above disclosed applications.

TECHNICAL FIELD

The present invention relates to a wideband oscillation circuit that outputs an oscillation signal the frequency of which can be varied in a wide range and particularly, to a wideband oscillation circuit having a oscillation circuit and a divider circuit that divides an output thereof.

BACKGROUND

As an oscillation circuit capable of variably setting its oscillation frequency, for example, various LC type voltage control oscillators have been conventionally developed. In an LC type voltage control oscillator, the capacitance value of a capacitor is set variably by a control voltage and an oscillating state of a switching element configuring an oscillation circuit, i.e., an oscillation frequency is controlled in accordance with the capacitance value variably set.

The LC type voltage control oscillator has comparatively high frequency precision of an oscillation signal in a fixed frequency range and is widely spread as an oscillator to be provided in, for example, a communication device required to continuously vary reception frequencies and transmission frequencies.

Recently, as frequency bands used in radio communication, a very high frequency band of several gigahertz is being used. For example, there is a radio communication terminal which is used as a mobile telephone terminal and which performs radio communication in a frequency band from several hundreds of megahertz to several gigahertz with a single unit.

However, it is difficult for an LC type voltage control oscillator built in a communication device, etc., conventionally to oscillate in such a wide frequency range and if an attempt is made to expand the oscillation frequency range forcedly, there arises such a problem that the noise characteristic of the oscillation signal is deteriorated. Because of this, conventionally, for example, a plurality of LC type oscillation circuits having different oscillation frequency ranges is provided to deal with wideband communication.

Such a configuration comprising the plurality of oscillation circuits is not preferable not only because its circuit scale is large and cost is high but also because power consumption is high. Given a wideband oscillation circuit, it is only necessary to provide one circuit and because the circuit scale and cost can be reduced and at the same time, the power consumption of the communication device can also be reduced, and therefore, a high quality oscillation circuit having a wideband and excellent noise characteristic has been demanded.

In such circumstances described above, there has been proposed an oscillation circuit the oscillation frequency range of which is expanded by dividing the oscillation output of a voltage control oscillator by a plurality of dividers and mixing the outputs of the plurality of dividers. However, the circuit configuration in which the outputs of the plurality of dividers are mixed has such a problem that a signal occurs in an unwanted band at the time of mixing by a mixer, i.e., so-called spurious occurs, and this results in a problem in practical use. Further, for radio communication, a four-phase oscillation output is necessary, however, with the configuration comprising a mixer, it is difficult to obtain a four-phase output.

In order to solve the above-mentioned problem, JP2009-225438A describes a wideband voltage control oscillation circuit that combines an LC type voltage control oscillator (VCO) having a narrow band but low phase noise and an injection locked frequency divider (ILFD).

FIG. 1A to FIG. 1C are diagrams showing the configuration and operation characteristics of the wideband voltage control oscillation circuit described in JP2009-225438A, wherein FIG. 1A shows the configuration, FIG. 1B shows changes in locked frequency range of the ILFD, and FIG. 1C shows the frequency range of an oscillation signal output from the wideband voltage control oscillation circuit.

As shown in FIG. 1A, the wideband voltage control oscillation circuit described in JP2009-225438A comprises an LC type voltage control oscillator (VCO) 11, an injection locked frequency divider (ILFD) 12, and a control part 13 that controls the oscillation frequency range of the ILFD 12 by outputting a bias voltage VbD of an inverter circuit of the ILFD 12.

The LC type VCO 11 generates an oscillation signal of a frequency f0. The LC type VCO 11 is configured so that the capacitance value of a capacitor in a circuit varies in accordance with a control voltage and thereby the time constant of the oscillating operation varies. There is also a configuration in which an inductance value is varied instead of the capacitance value or a configuration in which both the capacitance value and the inductance value are varied. The LC type VCO 11 outputs an oscillation signal having a high frequency range of f0=8 GHz to 12 GHz and the oscillation signal has a comparatively excellent low noise characteristic.

The ILFD 12 comprises a plurality of inverter circuits connected in the form of a ring and is a ring oscillator type free-run oscillation circuit. The oscillating operation is regulated by the oscillation signal of the frequency f0 output from the LC type VCO 11 and a divided signal of the oscillation signal of the frequency f0 is generated. The free-run frequency of the ILFD 12 varies by controlling the bias voltage VbD of the inverter circuit, and therefore, the division ratio varies. The control circuit 13 controls the bias voltage of the inverter circuit in accordance with the frequency of the divided signal output from the ILFD 12.

FIG. 1B is a diagram showing the change in the range of the locked frequency of the ILFD 12, i.e., in the frequency range of a divided signal in accordance with the voltage signal VbD output from the control part 13 when f0=8 GHz. As shown in FIG. 1A, when the oscillation signal of f0=8 GHz is divided by 2 and a divided signal of 4 GHz is output, the bias voltage VbD of the inverter circuit is controlled so that the locked frequency of the ILFD 12 is in the range denoted by A. Similarly, when the oscillation signal of f0=8 GHz is divided by 3 and 4, the bias voltage VbD of the inverter circuit is controlled so that the locked frequencies of the ILFD 12 are in the ranges denoted by B and C, respectively.

FIG. 1C is a diagram showing the frequency range obtained by the oscillation circuit described in JP2009-225438A. As described above, the LC type VCO 11 outputs the oscillation signal of f0=8 GHz to 12 GHz and in this range, the oscillation frequency can be varied. It is possible for the ILFD 12 to divide the oscillation signal that is input so that the frequency is 1/2, 1/3, 1/4, and 1/6 the original one by controlling the bias voltage VbD of the inverter circuit. In other words, it is possible to divide the oscillation signal of the frequency f0 by 2, 3, 4, 6.

As shown in FIG. 1C, it is possible for the LC type VCO 11 to output the oscillation signal of f0=8 GHz to 12 GHz and by dividing this by 2, a divided signal of 4 GHz to 6 GHz can be obtained. Similarly, by dividing the oscillation signal by 3, a divided signal of 2.66 GHz to 4 GHz can be obtained, by dividing by 4, a divided signal of 2 GHz to 3 GHz can be obtained, and by dividing by 6, a divided signal of f0=1.33 GHz to 2 GHz can be obtained. Further, by dividing by 2 the divided signal output from the ILFD 12 by a normal division-by-2 circuit, a divided signal of 2 GHz to 3 GHz can be obtained and by repeating division by the normal division-by-2 circuit, a divided signal of a lower frequency can be obtained. A divided signal obtained by the normal division-by-2 circuit is also a low noise signal without spurious.

As described above, according to the oscillation circuit described in JP2009-225438A, it is possible to generate oscillation signals of continuous frequencies of 15 MHz to 6 GHz.

RELATED DOCUMENTS

JP2009-225438A

S. Hara, K. Okada and A. Matsuzawa, "A 9.3 MHz to 5.7 GHz Tunable LC-based VCO Using a Divide-by-N Injection-Locked Frequency Divider", IEEE A-SSCC, November 2009

B. Razavi, "Multi-Decade Carrier Generation for Cognitive Radios", IEEE Symp. on VLSI Circuits, pp. 120-121, June 2009

P. Nuzzo, K. Vengattaramane, M. Ingels, V. Giannini, M. Steyaert and J. Craninckx, "A 0.1-5 GHz Dual-VCO Software-Defined ΣΔFrequency Synthesizer in 45 nm Digital CMOS", IEEE RFIC Symp. pp. 321-324, June 2009

Y, Ito, H. Sugawara, K. Okada and K. Masu, "A 0.98 to 6.6 GHz Tunable Wideband VCO in a 180 nm CMOS Technology for Reconfigurable Radio Tranceiver", IEEE Asian Solid-State Circuits Conference (A-SSCC), pp. 359-362, Hangzhou, China, November 2006

SUMMARY OF THE INVENTION

In FIG. 1C, it is possible to obtain a divided signal of 4 GHz by divining by 2 the oscillation signal of f0=8 GHz or by dividing by 3 the oscillation signal of f0=12 GHz, however, to this end, it is necessary for the divided signal of 8 GHz/2 and the divided signal of 12 GHz/3 to be continuous. Consequently, the LC type VCO 11 requires a frequency variable range 3/2 or more the range in which the division ratio 1/2 is equivalent to the division ratio 1/3, in other words, a frequency variable range of ±20% or more for 10 GHz.

The frequency band and the phase noise of an oscillation signal output from the LC type VCO 11 has a relationship of tradeoff and the wider the band, the more the phase noise deteriorates. When the oscillation signal output from the LC type VCO 11 is set in a wide band of 8 GHz to 12 GHz, there arises such a problem that the phase noise cannot be maintained at a sufficient quality level. In order to improve the phase noise, a wideband oscillation circuit is desired which is capable of outputting oscillation signals (divided signals) of continuous frequencies even if the frequency band of the LC type VCO 11 is narrowed.

An object of the present invention is to realize a wideband oscillation circuit capable of outputting oscillation signals (divided signals) of continuous frequencies even if the frequency band of the oscillation signals output from an LC type VCO is comparatively narrow.

In order to realize the above-mentioned object, in a wideband oscillation circuit of the present invention, between an oscillator and an injection locked frequency divider (IFLD), a filter is provided which controls the passing characteristic that causes an oscillation signal to pass with respect time in accordance with a filter control signal locked with a divided signal and an output of the filter is injected into the injection locked frequency divider (IFLD).

That is, the wideband oscillation circuit of the present invention comprises an oscillator that outputs an oscillation signal; a filter that receives and filters the oscillation signal output from the oscillator, and outputs an injection locked signal; and an injection locked frequency divider that performs a free-run operation and outputs a divided signal of the oscillation signal while its oscillating operation is regulated by the injection locked signal, the division ratio of which varies in accordance with a control signal, wherein the filter generates the injection locked signal by controlling the passing characteristic that caused the oscillation signal to pass with respect to time in accordance with a filter control signal locked with the divided signal.

In the wideband oscillation circuit of the present invention, the filter controls the passing characteristic that causes an oscillation signal to pass with respect to time in accordance with the filter control signal locked with a divided signal, and therefore, it is possible for the injection locked frequency divider to generate a divided signal in a division ratio other than integer division ratios. Due to this, it is possible to overlap the frequency ranges by increasing the number of frequency ranges of divided signals generated by the injection locked frequency divider, and therefore, it is possible to generate divided signals of continuous frequencies even if the variable frequency range of the oscillation signals output from the oscillator is narrow.

For example, according to the conventional example described in JP2009-225438A, it is possible to divide a frequency into 1/2, 1/3, 1/4, and 1/6 the original one and the ratio of division ratios between 1/2 to 1/3 is 3/2 and similarly, the ratios between 1/3 to 1/4 and between 1/4 to 1/6 are 4/3 and 6/4, respectively, and the maximum ratio is between 1/2 to 1/3, that is, 3/2, and therefore, the VCO 11 requires a frequency variable range of 3/2 times (±20%) the original one.

In contrast to this, according to the present invention, it is possible to divide a frequency into 3/4, 2/3, 3/5, 1/2, 2/5, 1/3, 1/4, and 1/5 the original one and the ratios to put frequency ranges adjacent to one another are 9/8, 10/9, 6/5, 5/4, 6/5, 4/3, and 5/4 and the maximum ratio is between 1/3 to 1/4, that is, 4/3, and therefore, the VCO 11 requires only a frequency variable range of 4/3 times (±14.3%) the original one.

It is desirable for the injection locked frequency divider to be a ring oscillator type ILFD having a differential two-stage configuration and to be a circuit in which the division ratio is varied by varying the bias voltage of a differential amplifier, however, as long as the same functions are provided, any type can be used and for example, the load capacitances may be switched.

When the injection locked frequency divider is the ring oscillator type ILFD having a differential two-stage configuration, the ILFD outputs a four-phase divided signal. The filter control signal uses an output signal of one of stages of the ILFD and is applied to a switch that connects the output of the other stage of the ILFD in accordance with the injection locked signal. The connection in this case includes a case where they are short-circuited or connected with a certain impedance. It is possible for the filter control signal to use any of the four-phase divided signals of the ILFD, however, it is necessary to appropriately select a position in the circuit of the ILFD to which the injection locked signal is applied. Further, it is also possible for a plurality of filters to generate a plurality of injection locked signals, respectively, by using a plurality of signals of the four-phase divided signals of the ILFD as filter control signals to control the passing characteristic that causes the oscillation signal to pass with respect to time in accordance with the plurality of filter control signals and to apply the plurality of injection locked signals to a plurality of positions in the circuit of the ILFD.

It is possible to configure a filter so as to comprise an input terminal to which an oscillation signal is input and an output terminal that outputs an injection locked signal, a passing switch that controls the passing characteristic that cause an oscillation signal to pass, and a connection switch that controls whether or not to connect the output terminal of the passing switch to a predetermined potential and so that the connection switch enters a connection state as well as the passing switch enters a suppressed state in accordance with the filter control signal. The passing switch and the connection switch are configured by two transistors, i.e., one having a different polarity and one having the same polarity so that the divided signals output from the injection locked frequency divider (IFLD) are applied to the gates of the two transistors. It may also be possible to configure the passing switch and the connection switch by two transistors so that the gates of the two transistors are connected to a predetermined potential via a resistor and at the same time, to which the divided signals are applied via a capacitor.

According to the present invention, it is possible to overlap frequency ranges by increasing the number of frequency ranges of divided signals generated by the injection locked frequency divider, and therefore, the variable frequency range of oscillation signals output from an oscillator can be narrowed and the phase noise of the oscillation signal (divided signal) can be improved accordingly.

BRIEF DESCRIPTION OF THE DRAWINGS

FIG. 12 is a diagram showing a relationship between examples of positions to which injection locked signals shown in FIG. 10A to FIG. 10C are applied and division ratios in which division can be made.

DESCRIPTION OF THE PREFERRED EMBODIMENTS

Figure 2:
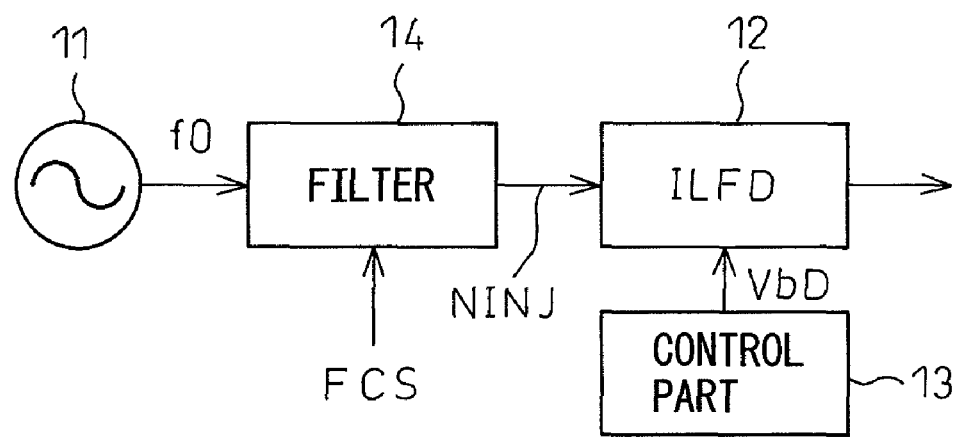
FIG. 2 is a block diagram showing a basic configuration of a wideband voltage control oscillation circuit in an embodiment of the present invention.

FIG. 2 is a diagram showing a basic configuration of a wideband oscillation circuit in an embodiment of the present invention.

As shown in FIG. 2, the wideband oscillation circuit in the embodiment comprises an LC type voltage control oscillator (VCO) 11, an injection locked frequency divider (ILFD) 12, a control part 13 that outputs a bias voltage VbD of an inverter circuit of the ILFD 12 to control an oscillation frequency range of the ILFD 12, and a filter 14 that receives an oscillation signal of a frequency f0 output from the VCO 11, filters it, and outputs an injection locked signal NINJ to the ILFD 12.

Figure 1A:
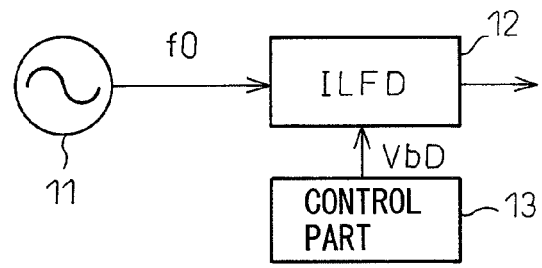
FIG. 1A to FIG. 1C are diagrams showing a general configuration and an operation characteristic of a wideband voltage control oscillation circuit that combines a conventional LC type voltage control oscillator (VCO) and an injection locked frequency divider (ILFD).
Figure 1B:
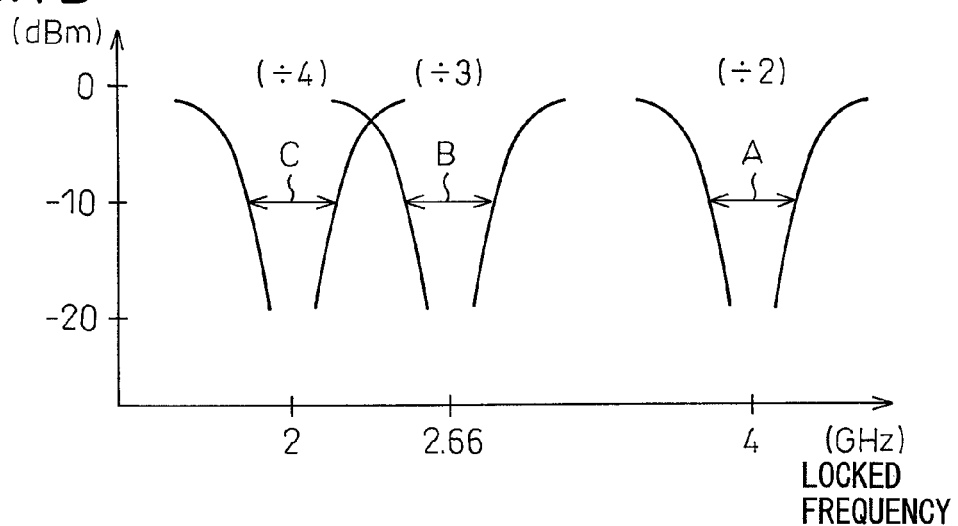
Figure 1C:
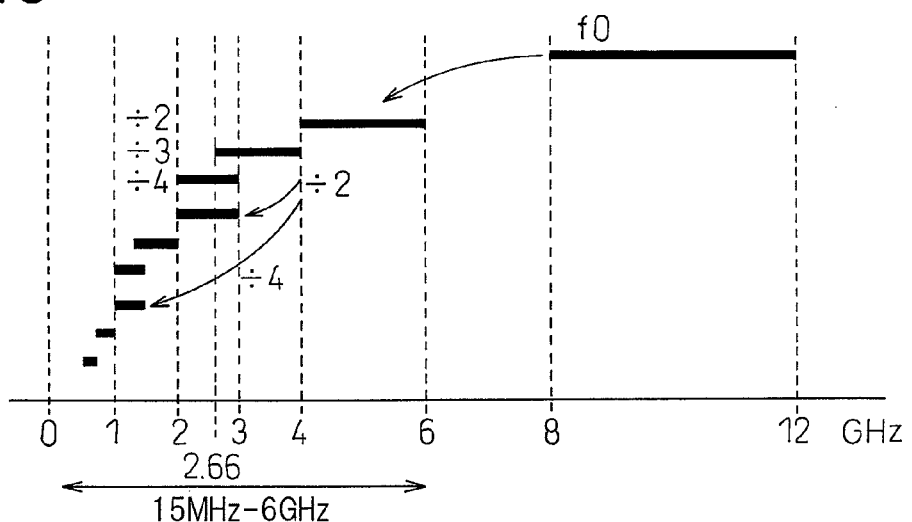

The LC type VCO 11 is the same as that described in JP2009-225438A described in FIG. 1, and therefore, it is also possible for the LC type VCO 11 to comprise a configuration in which an inductance value is varied instead of a capacitance value, a configuration in which both the capacitance value and the inductance value are varied, etc.

The ILFD 12 and the control part 13 are the same as those described in JP2009-225438A described in FIG. 1, however, in the embodiment, the control part 13 controls the bias voltage VbD of the inverter circuit of the ILFD 12 more meticulously than the case described in JP2009-225438A and controls the range of the free-run oscillation frequency more precisely.

The ILFD 12, the oscillating operation of which is regulated by the injection locked signal NINJ, generates a divided signal that is an oscillation signal of the frequency f0 divided in a division ratio of an integer and in a division ratio of a number other than an integer.

The filter 14 generates the injection locked signal NINJ by controlling the passing characteristic that causes the oscillation signal of the frequency f0 to pass with respect to time in accordance with a filter control signal FCS locked with the divided signal. To control with respect to time means where or not to pass the pulse of the oscillation signal, i.e., to thin part of pulses of the oscillation signal. Further, it is not possible for a switch by a transistor to create a perfectly shielded state, and therefore, it is assumed that the control of the passing characteristic with respect to time includes a case where the pulses are suppressed partially and thus the signal of the pulse that passes becomes small partially. In the following explanation, it is assumed that a passing switch becomes the perfectly shielded state for the sake of convenience of explanation, however, it is also assumed that the suppressed state is also included. The filter control signal FCS is a signal locked with a divided signal and it is also possible to use a signal generated from the oscillation signal of the frequency f0 in a predetermined division ratio as well as a divided signal generated by the ILFD 12.

The oscillating operation of the ILFD 12 is regulated by the injection locked signal NINJ. The injection locked signal NINJ is a signal from which the oscillation signal of the frequency f0 is thinned and the number of times the oscillating operation of the ILFD 12 is regulated becomes smaller than that when it is regulated by the oscillation signal of the frequency f0. Because of this, it is possible for the ILFD 12 to oscillate in a larger number of ways when the oscillating operation is regulated by the injection locked signal NINJ than when the oscillating operation is regulated by the oscillation signal of the frequency f0 and it is also possible to oscillate at a frequency when the oscillation signal of the frequency f0 is divided in a division ratio of a number other than an integer. It is possible to set a frequency at which the ILFD 12 oscillates actually from among a variety of oscillatable frequencies of the ILFD 12 by appropriately selecting a free-run frequency range using the signal VbD output from the control part 13.

Figure 3:
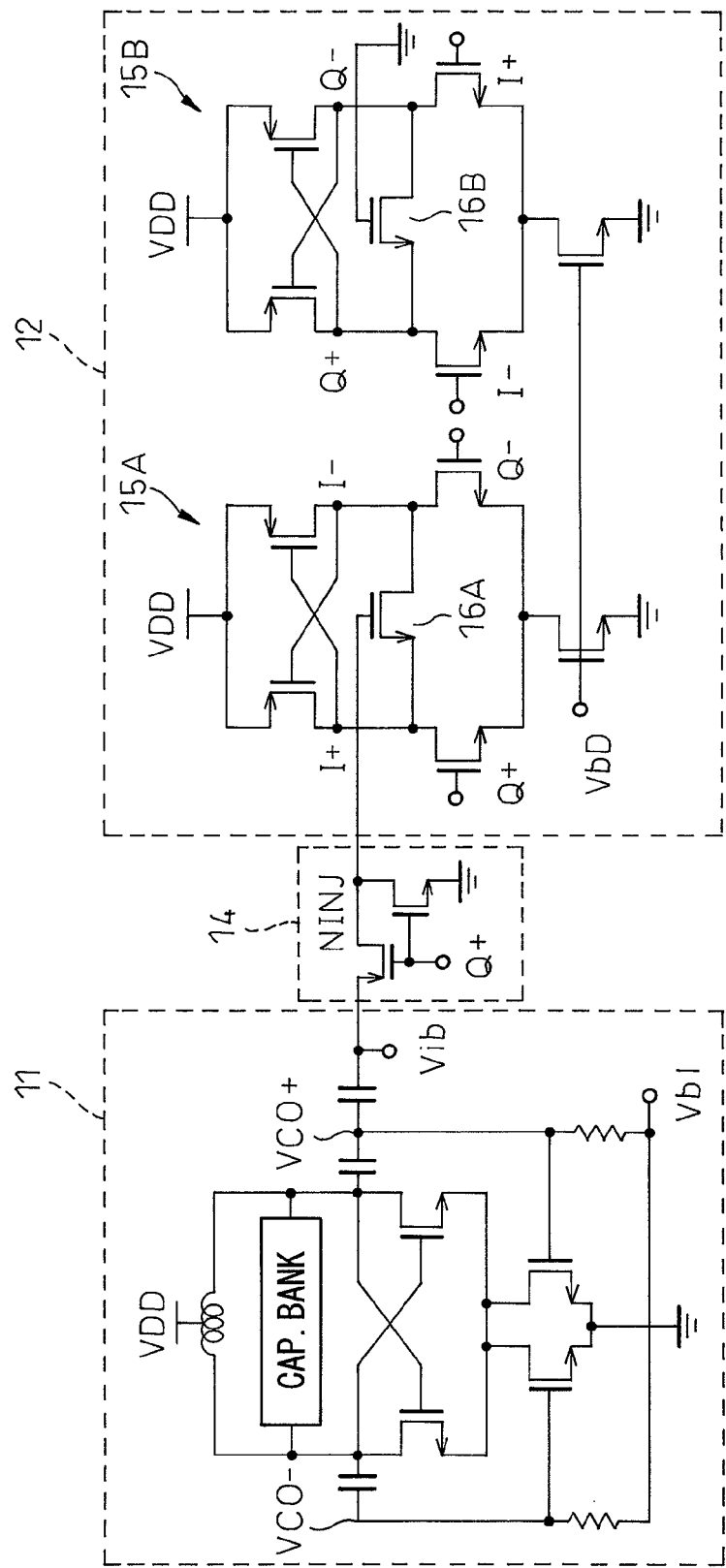
FIG. 3 is a circuit diagram showing a specific circuit configuration of a wideband voltage control oscillation circuit in an embodiment.

FIG. 3 is a diagram showing a detailed circuit configuration of the wideband oscillation circuit in the embodiment of the present invention. The configuration shown in FIG. 3 is a circuit example obtained by further embodying the basic configuration in FIG. 2. In FIG. 3, the schematic representation of the control part 13 is omitted.

Figure 4:
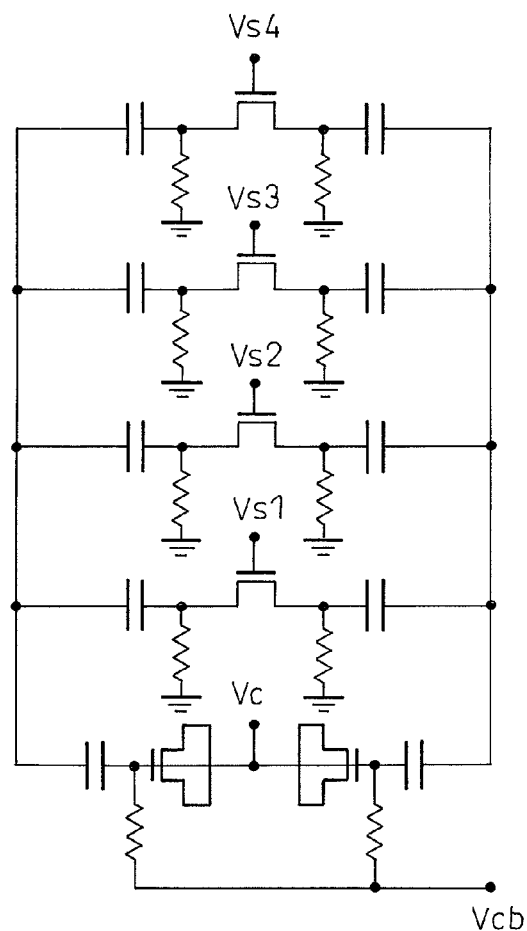
FIG. 4 is a diagram showing a configuration example of a capacitor bank provided in an LC type voltage control oscillator (VCO) in an embodiment.

FIG. 4 is a diagram showing a circuit configuration of a capacitor bank Cap. bank to select a capacitance value of the LC type VCO 11 of the wideband oscillation circuit in the embodiment.

The LC type VCO 11 of the wideband oscillation circuit in the embodiment shown in FIG. 3 and FIG. 4 resembles VCO described in S. Hara, K. Okada and A. Matsuzawa, "A 9.3 MHz to 5.7 GHz Tunable LC-based VCO Using a Divide-by-N Injection-Locked Frequency Divider", IEEE A-SSCC, November 2009, and its configuration and operation are widely known, and therefore, a detailed explanation is omitted here.

The LC type VCO 11 of the wideband oscillation circuit in the embodiment generates complementary oscillation signals VCO+ and VCO− in a range where the oscillation frequency can be varied between 8 GHz and 12 GHz.

Returning to FIG. 3, the filter 14 has a PMOS transistor and an NMOS transistor. The PMOS transistor forms a passing switch that controls whether or not to pass the oscillation signal VCO+. The passing switch has an input terminal to which the oscillation signal VCO+ is input and an output terminal from which the injection locked signal NINJ is output and a source of the PMOS transistor corresponds to the input terminal and a drain of the PMOS transistor corresponds to the output terminal, respectively. The NMOS transistor forms a connection switch that controls whether or not to connect the output terminal of the passing switch, that is, the source of the PMOS transistor to the ground level. To gates of the PMOS transistor and the NMOS transistor, a divided signal Q+ among the four divided signals of the ILFD 12 is applied.

In the filter 14, when the divided signal Q+ is at a low level, the PMOS transistor enters the conduction (ON) state and NMOS transistor enters the shielded (OF) state, and thereby, the oscillation signal VCO+ is caused to pass. When the divided signal Q+ is at a high level, the PMOS transistor enters the shielded (OFF) state and the NMOS transistor enters the conduction (ON) state, and thereby, the oscillation signal VCO+ is prevented from passing and the output terminal changes to a low level.

The ILFD 12 is a ring oscillator type oscillation circuit in which two differential inverters 15A and 15B are connected in the form of a ring and a first output I+ of the differential inverter 15A in the first stage is input to a second input of the differential inverter 15B in the second stage, a second output I− of the differential inverter 15A in the first stage is input to a first input of the differential inverter 15B in the second stage, the first output Q+ of the differential inverter 15B in the second stage is input to a first input of the differential inverter 15A in the first stage, and a second output Q− of the differential inverter 15B in the second stage is input to a second input of the differential inverter 15A in the first stage, respectively. To the gate of the NMOS transistor for the bias of the two differential inverters, the signal VbD from the control part 13 is applied and a bias voltage is set. An NMOS transistor 16A is connected between the first output and the second output of the differential inverter in the first stage and to the gate thereof, the injection locked signal NINJ is applied. Consequently, when the injection locked signal NINJ is at the high level, the first output I+ and the second output I− of the differential inverter 15A in the first stage are short-circuited and I+ and I− become the same level (intermediate level). The short-circuited state is assumed to include a state where connection is made with a certain impedance (resistance). An NMOS transistor 16B is connected between the first output and the second output of the differential inverter 15B in the second stage and its gate is connected to the ground level. Consequently, the NMOS transistor 16B is not brought into the conduction (ON) state, and therefore, the ILFD 12 operates even if the NMOS transistor 16B is not provided, however, in the embodiment, it is provided in order to improve the symmetry between the differential inverters in the first stage and in the second stage. As will be described later, in order to further improve the symmetry, it may also be possible to apply a predetermined potential to the gate of the NMOS transistor 16B so that the impedance between the first output and the second output of the differential inverter 15B becomes a predetermined value. As described above, the ILFD 12 generates the four-phase divided signals I+, I−, Q+, and Q−.

Figure 5:
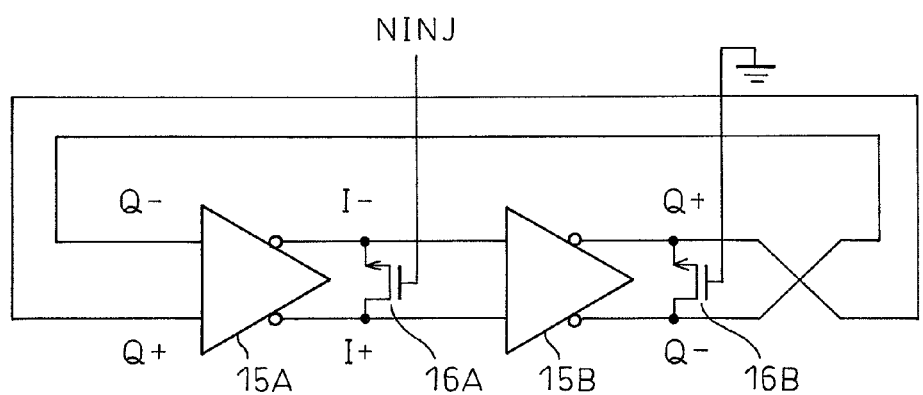
FIG. 5 is a circuit diagram representing an injection locked frequency divider (ILFD) in an embodiment by inverter symbols.

FIG. 5 is a circuit diagram when the differential inverters are represented by inverter symbols in the ILFD 12 shown in FIG. 3.

The ILFD 12 of the wideband oscillation circuit in the embodiment shown in FIG. 3 and FIG. 5 resembles the ILFD described in JP2009-225438A and in S. Hara, K. Okada and A. Matsuzawa, "A 9.3 MHz to 5.7 GHz Tunable LC-based VCO Using a Divide-by-N Injection-Locked Frequency Divider", IEEE A-SSCC, November 2009, and its configuration and operation are known, and therefore, more detailed explanations are omitted here.

Figure 6:
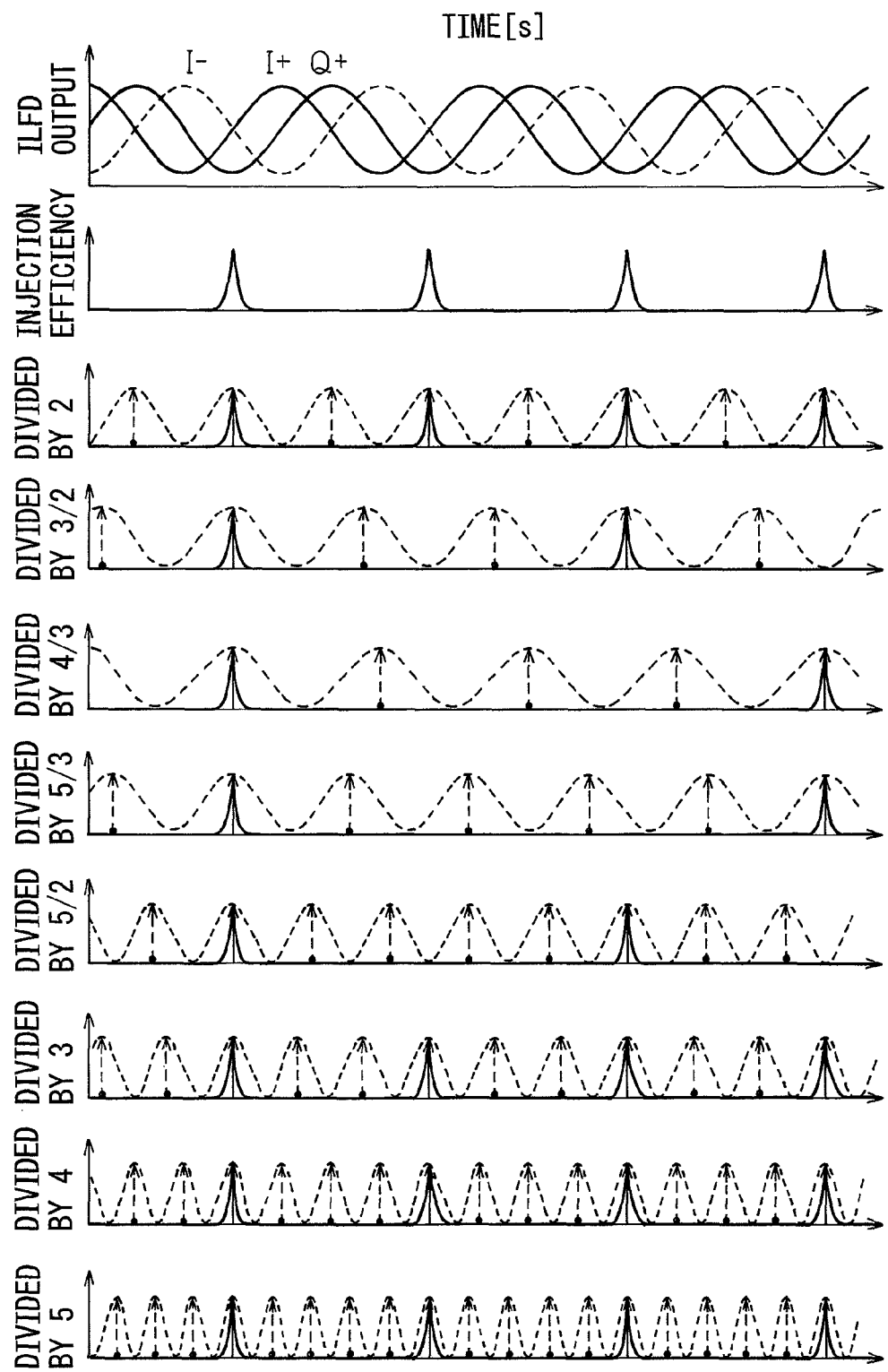
FIG. 6 is a time chart explaining the operation of a wideband oscillation circuit in an embodiment.

FIG. 6 is a time chart for explaining the operation of the wideband oscillation circuit in the embodiment, normalized by the cycle of the divided signal regardless of the division ratio. In FIG. 6 ILFD Output denotes I+, I−, and Q+ of the four-phase divided signals.

As described above, the filter 14 passes the oscillation signal VCO+ when the divided signal Q+ is at the low level and shields the oscillation signal VCO+ when the divided signal Q+ is at the high level. Here, it is assumed that the threshold values of the PMOS transistor and the NMOS transistor are set so that the oscillation signal VCO+ is caused to pass only in a short period of time during which the divided signal Q+ is near the minimum level and shielded otherwise. Due to this, an injection efficiency at which the injection locked signal NINJ is supplied to the ILFD 12 varies in the form of a pulse that appears in correspondence to a low level part of the divided signal Q+ as shown in FIG. 6.

In FIG. 6, VCO+ varies in the form of a sinusoidal wave denoted by the dotted line. When the high level of VCO+ agrees with the pulse of the injection efficiency, the high level of the injection locked signal NINJ is supplied to the ILFD 12, causing I+ and I− to be at the same level. When divided by 2, VCO+ and NINJ agree with each other once in two cycles of VCO+ and once in one cycle of Q+ and oscillation occurs in this cycle. In other words, oscillation occurs in twice the cycle of VCO+. Similarly, when divided by 3, 4, and 5, VCO+ agrees with NINJ once in three cycles, four cycles, and five cycles of VCO+ and once in one cycle of Q+, and oscillation occurs in three times, four times, and five times the cycle of VCO+.

In contrast to this, when divided by 3/2, VCO+ agrees with NINJ once in three cycles of VCO+ and once in two cycles of Q+ and oscillation occurs in 2/3 times the cycle of VCO+. When divided by 4/3, VCO+ agrees with NINJ once in four cycles of VCO+ and once in three cycles of Q+ and oscillation occurs in 3/4 times the cycle of VCO+. Further, when divided by 5/3, VCO+ agrees with NINJ once in five cycles of VCO+ and one in three cycles of Q+ and oscillation occurs in 3/5 the cycle of VCO+. Furthermore, when divided by 5/2, VCO+ agrees with NINJ once in five cycles of VCO+ and once in two cycles of Q+ and oscillation occurs in 2/5 times the cycle of VCO+.

When it is only required to simply regulate a pair of divided signals, oscillation can occur in a cycle, which is the above-mentioned cycle divided by an integer, however, by setting the free-run oscillation frequency of the ILFD 12 by the signal VbD from the control part 13, oscillation is caused to occur at the above-mentioned frequency and the oscillating state is locked to maintain the state.

Figure 7:
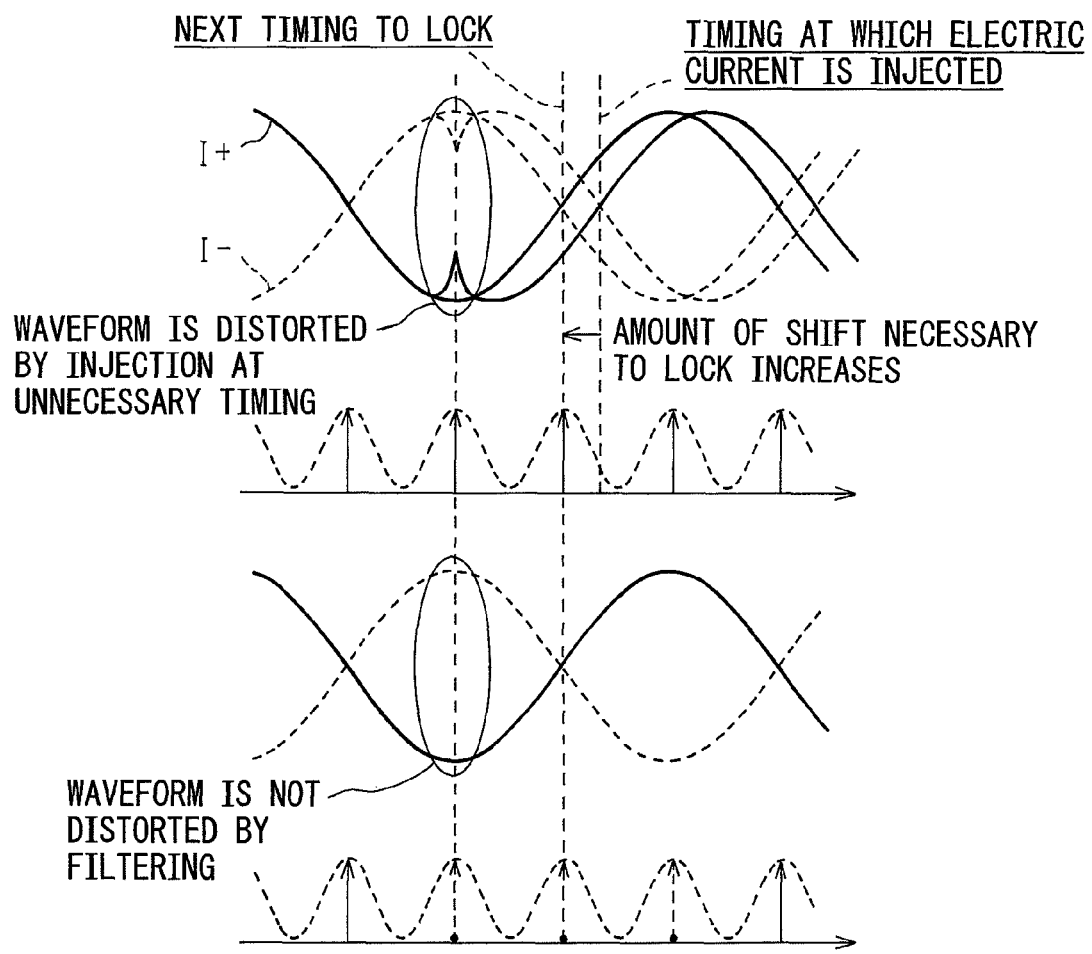
FIG. 7 is a diagram explaining a difference in the operation between a conventional example in which an oscillation signal is supplied directly to an ILFD without providing a filter and an embodiment.

FIG. 7 is a diagram for explaining a difference in the operation between the case where VCO+ is supplied directly to the ILFD 12 without proving the filter 14 described in JP2009-225438A and the case in the embodiment using a division by 4 as an example.

As shown in FIG. 7, when divided by 4, the cycle of the divided signals I+ and I− agrees with the four cycles of VCO+. If VCO+ is supplied directly to the ILFD 12, the divided signals I+ and I− become the same level and intersect when VCO+ is supplied. After one cycle of VCO+ from this point of time, I+ becomes the minimum level and I− the maximum level and further, after one cycle of VCO+(after two cycles in total), I+ and I− intersect and further, after one cycle of VCO+ (after three cycles in total), I+ becomes the maximum level and I− the minimum level, and further, after one cycle (after four cycles in total), I+ and I− intersect. This is one cycle of the divided signals I+ and I−.

As shown on the upper side in FIG. 7, when VCO+ is supplied directly to the ILFD 12, after one cycle of VCO+ after the divided signals I+ and I− intersect, in the vicinity of the point of time where I+ becomes the minimum level and I− the maximum level, the operation is done so that VCO+ is applied to the ILFD 12 and the output terminals I+ and I− are short-circuited, and therefore, I+ increases slightly and I− decreases slightly and the waveforms of the I+ and I− are distorted at the part of the crest and the trough. Because of this distortion, the timing at which I+ and I− intersect again after two cycles of VCO+ is delayed and an amount of phase shift to lock the division by 4 increases. This causes the phase noise to increase.

In contras to this, in the embodiment, as shown on the lower side in FIG. 7, VCO+ after one cycle, two cycles, and three cycles of VCO+ after the divided signals I+ and I− intersect is shielded by the filter 14 and the injection locked signal NINJ does not includes such a pulse of VCO+, and therefore, it is unlikely that the output terminals of I+ and I− are short-circuited. Because of this, the above-mentioned distortion does not occur and the phase noise does not increase.

Figure 8:
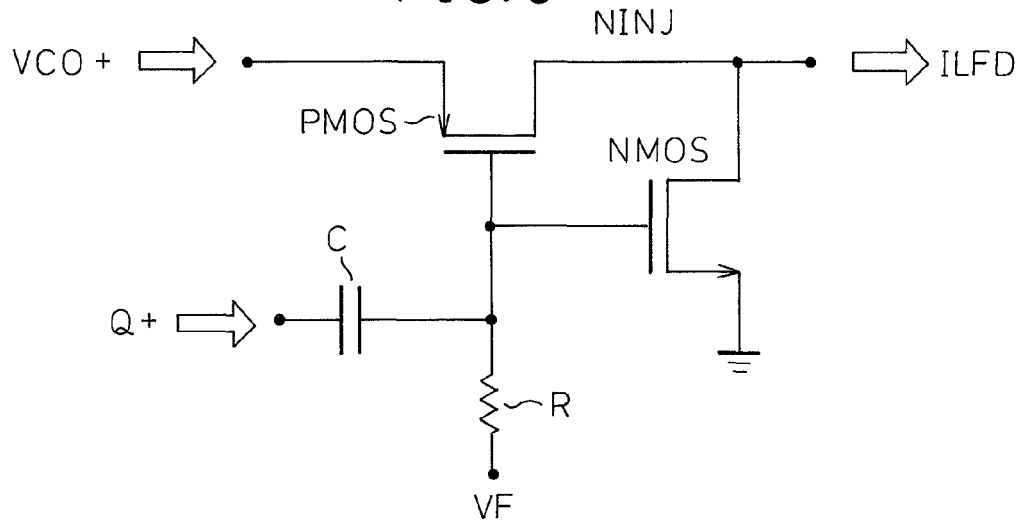
FIG. 8 is a diagram showing a configuration of a modified example of a filter in an embodiment.

FIG. 8 is a diagram showing a configuration of a modified example of the filter 14 in the embodiment.

The filter 14 shown in FIG. 8 applies the divided signal Q+ via a capacitor C as well as connecting the gate of the PMOS transistor forming the passing switch and the gate of the NMOS transistor forming the connection switch to a predetermined potential source VF via a resistor R in the filter 14 in the embodiment in FIG. 3. For the filter 14 in FIG. 8, it is possible to easily set a desired injection efficiency by appropriately setting the potential of the potential source VF, the resistor R, and the capacitance value of the capacitor C.

In the ILFD 12 of the wideband oscillation circuit in the embodiment shown in FIG. 3 and FIG. 5, the injection locked signal NINJ is applied to the gate of the NMOS transistor 16A that connects the output terminals of the differential inverter 15A in the first stage which outputs I+ and I−. In contrast to this, to the gate of the NMOS transistor 16B that connects the output terminals of the differential inverter 15B in the second stage which outputs Q+ and Q−, the ground level is applied and the setting is done so that the NMOS transistor 16B does not operate substantially. However, it is also possible to cause the NMOS transistor 16B to operate to make Q+ and Q− the same level, i.e., to cause a short circuit.

Figure 9:
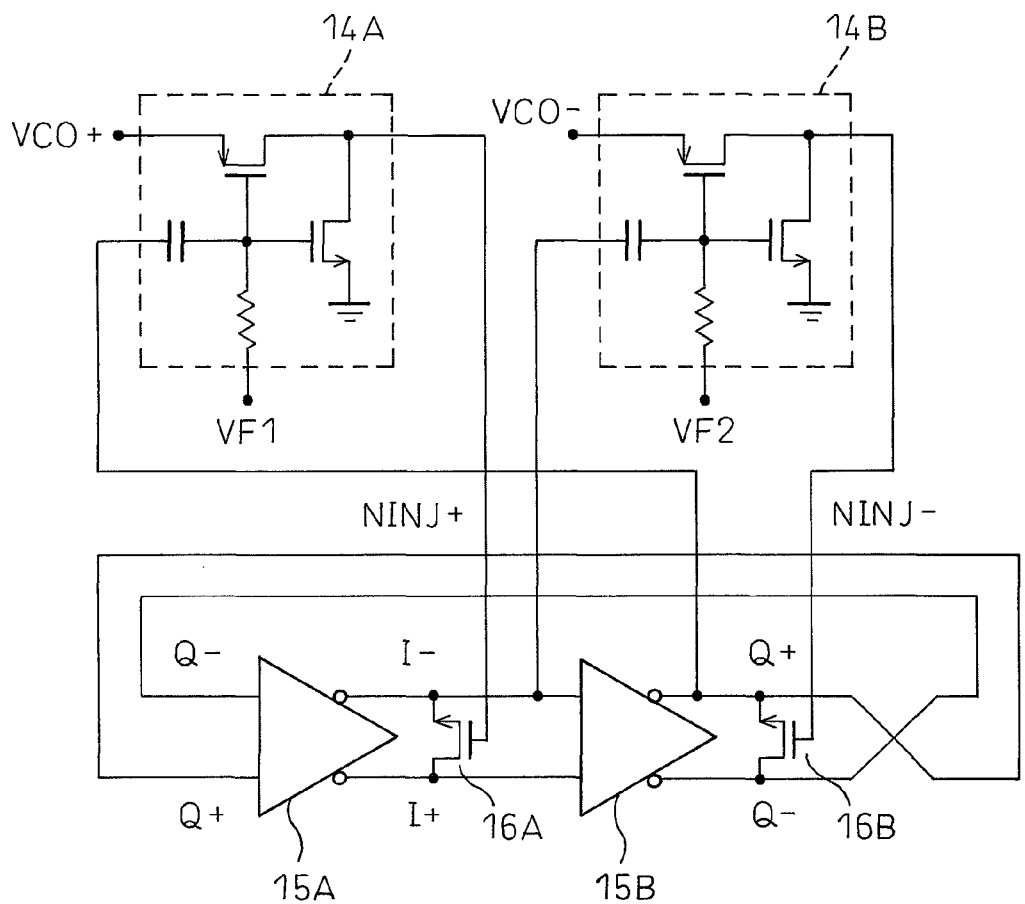
FIG. 9 is a diagram showing a circuit configuration of a modified example of an ILFD and a filter in an embodiment.

FIG. 9 is a diagram showing a circuit configuration of a modified example of the ILFD 12 and the filter 14 that cause the NMOS transistor 16B connecting the output terminals of the differential inverter in the second stage to operate to short-circuit Q+ and Q−. In FIG. 9, filter circuits 14A and 14B that generate injection locked signals NINJ+ and NINJ− to be applied to the gates of the NMOS transistors 16A and 16B comprise the circuit configuration shown in FIG. 8. To the filter circuit 14A, VCO+ is supplied and the divided signal Q+ is supplied via the capacitor C. Consequently, the injection locked signal NINJ+ is substantially the same as the injection locked signal NINJ in the embodiment. In contrast to this, to the filter circuit 14B, the other oscillation signal VCO− generated by the LC type VCO 11 is supplied and the divided signal I− is supplied via the capacitor C. Consequently, the injection locked signal NINJ− corresponds to the injection locked signal NINJ+ delayed by 1/4 cycle of the divided signal. The timing at which the divided signals I+ and I− intersect is shifted from the timing at which the divided signals Q+ and Q− intersect by 1/4 cycle of the divided signal. Consequently, if I+ and I−, and Q+ and Q− are short-circuited by applying the injection locked signals NINJ+ and NINJ− to the gates of the NMOS transistors 16A and 16B, the same divided signal is regulated in different positions and the divided signal is locked more firmly compared to the embodiment as a result.

The position where the injection locked signal is applied in the ILFD 12 is explained with reference to FIG. 10A to FIG. 10D. As will be described later, it is also possible to use the PMOS transistor instead of the NMOS transistor. FIG. 10A shows a configuration in which the NMOS transistor 16A is arranged between the output terminals of the differential inverter 15A in the first stage and NINJ+ is applied to the gate of the NMOS transistor 16.

The configuration in FIG. 10A is the same as the configuration except in that the NMOS transistor 16B that does not operate substantially is removed in the ILFD 12 in the embodiment and the operation is the same as that in the second embodiment.

Figure 10B:
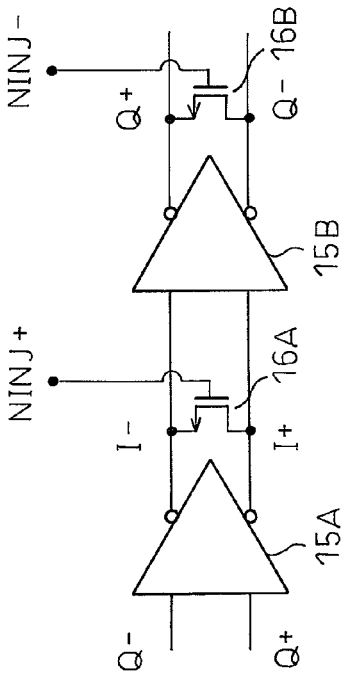
FIG. 10A to FIG. 10D are diagrams explaining positions to which injection locked signals are applied in an ILFD.
Figure 10D:
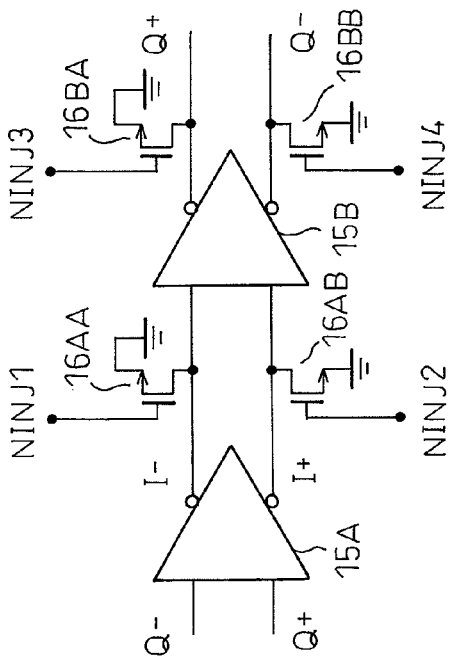
Figure 10A:
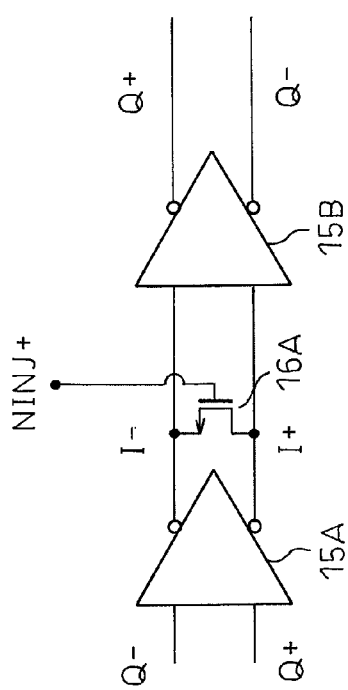

The configuration in FIG. 10B is the configuration shown in FIG. 9 in which a divided signal can be locked more firmly when divided by 2 compared to that in the configuration in FIG. 10A. However, this cannot be applied when divided by 3, 4, 5, and a non-integer. In the configuration in FIG. 10B, it may also be possible to set VF2 to be the same as VF1 in the filter 14A at the time of division by 2 and switch VF2 to a higher level at the time of other than the division by 2 in the filter 14B that generates the injection locked signal NINJ− so that the injection locked signal NINJ− is at the low level at all times and the NMOS transistor 16B does not operate. Due to this, the divided signal is locked firmly at the time of division by 2 and division by other than 2 is made possible.

Figure 10C:
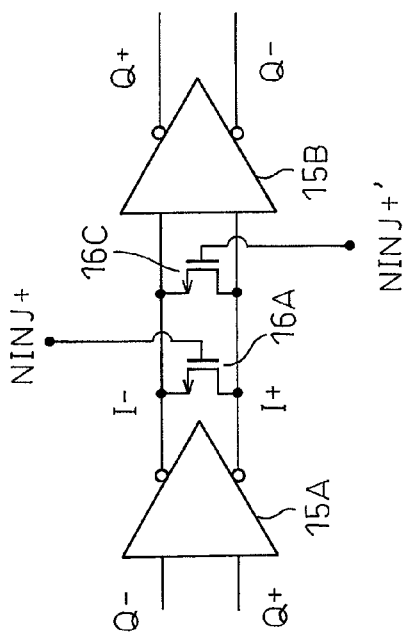

The configuration in FIG. 10C is the same as the configuration in 10A except in that the NMOS transistor 16A is added between the output terminals of the differential inverter 15A in the first stage and an NMOS transistor 16C is provided. An injection locked signal NINJ+' to be applied to the gate of the NMOS transistor 16C is generated by supplying Q− instead of Q+ in the filter circuit in FIG. 8. The configuration in FIG. 10C can be applied only to the division by 4 but cannot be applied for other division ratios.

In the configuration in FIG. 10D, the output terminal of I− of the differential inverter 15A in the first stage is connected to the ground level via an NMOS transistor 16AA and the output terminal of I+ is connected to the ground level via an NMOS transistor 16AB, the output terminal of Q+ of the differential inverter 15B in the second stage is connected to the ground level via an NMOS transistor 16BA, and the output terminal of Q− is connected to the ground level via an NMOS transistor 16BB. An injection locked signal NINJ1 to be applied to the gate of the NMOS transistor 16AA is generated by supplying I− instead of Q+ in the filter circuit in FIG. 8. Similarly, injection locked signals NINJ2 to 4 to be applied to the gates of the NMOS transistors 16AB, 16BA, and 16BB are generated by supplying I+, Q+, and Q−, respectively, instead of Q+ in the filter circuit in FIG. 8. It is also possible to connect the NMOS transistors 16AA, 16AB, 16BA, and A16BB to a predetermined potential other than the ground level. Further, it is also possible to connect the NMOS transistors 16AA, 16AB, 16BA, and 16BB to a high potential source VDD or a predetermined potential as a PMOS transistor.

Figure 11:
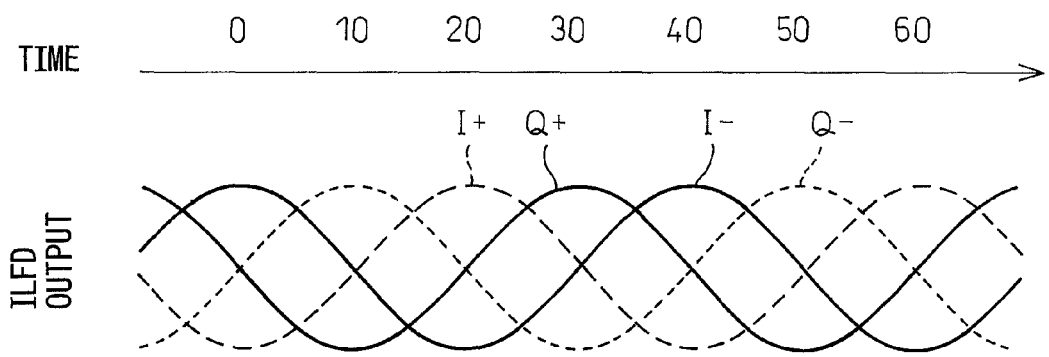
FIG. 11 is a diagram showing at which timing an oscillation signal can be applied for a four-phase divided signal in each division ratio.

FIG. 11 is a diagram showing at which timing VCO+ and VCO− can be applied for the divided signals I+, I−, Q+, and Q− in each division ratio, wherein one cycle of the divided signal is assumed to be 40 and the pair of Q+ and Q− is indicated by an underline.

As shown in FIG. 11, the pair of the divided signals I+ and I− intersects at 0, 20, 40, 60 and the pair of Q+ and Q− intersects at 10, 30, 50.

When divided by 2, the oscillation signal VCO+ can be applied to the divided signals I+ to I− at 0, 20, 40, 60 and VCO− can be applied to Q+ and Q− at 10, 30, 50.

When divided by 3, the oscillation signal VCO+ can be applied to the divided signals I+ to I− at 0, 13 (to be exact, 40/3), 27, 40, 53 and VCO− can be applied to Q+ and Q− at 7, 20, 33, 47, 60.

When divided by 4, the oscillation signal VCO+ can be applied to the divided signals I+ to I− at 0, 10, 20, 30, 40, 50, 60 and VCO− can be applied to Q+ and Q− at 5, 10, 15, 25, 35, 45, 55.

When divided by 5, the oscillation signal VCO+ can be applied to the divided signals I+ to I− at 0, 8, 16, 24, 32, 40, 48, 56 and VCO− can be applied to Q+ and Q− at 4, 12, 20, 28, 36, 44, 52, 60.

When divided by 6, the oscillation signal VCO+ can be applied to the divided signals I+ to I− at 0, 7, 13, 20, 27, 33, 40, 47, 53, 60 and VCO− can be applied to Q+ and Q− at 3, 13, 20, 27, 33, 40, 47, 53, 60.

When divided by 4/3, the oscillation signal VCO+ can be applied to the divided signals I+ to I− at 0, 30, 60 and VCO− can be applied to Q+ and Q− at 15, 45.

When divided by 3/2, the oscillation signal VCO+ can be applied to the divided signals I+ to I− at 0, 27, 53 and VCO− can be applied to Q+ and Q− at 13, 40.

When divided by 5/2, the oscillation signal VCO+ can be applied to the divided signals I+ to I− at 0, 16, 32, 48 and VCO− can be applied to Q+ and Q− at 8, 24, 40, 56.

FIG. 12 is a diagram showing a relationship between examples of positions to which injection locked signals shown in FIG. 10A to FIG. 10C are applied and division ratios in which division can be made. With the configuration in FIG. 10A, division by 2, division by 3, division by 4, division by 5, division by 6, division by 4/3, division by 3/2, division by 5/2 can be made. With the configuration in FIG. 10B, division by 2 and division by 6 can be made, however, division cannot be made in other division ratios. With the configuration in FIG. 10C, only division by 4 can be made and division cannot be made in other division ratios.

Figure 13:
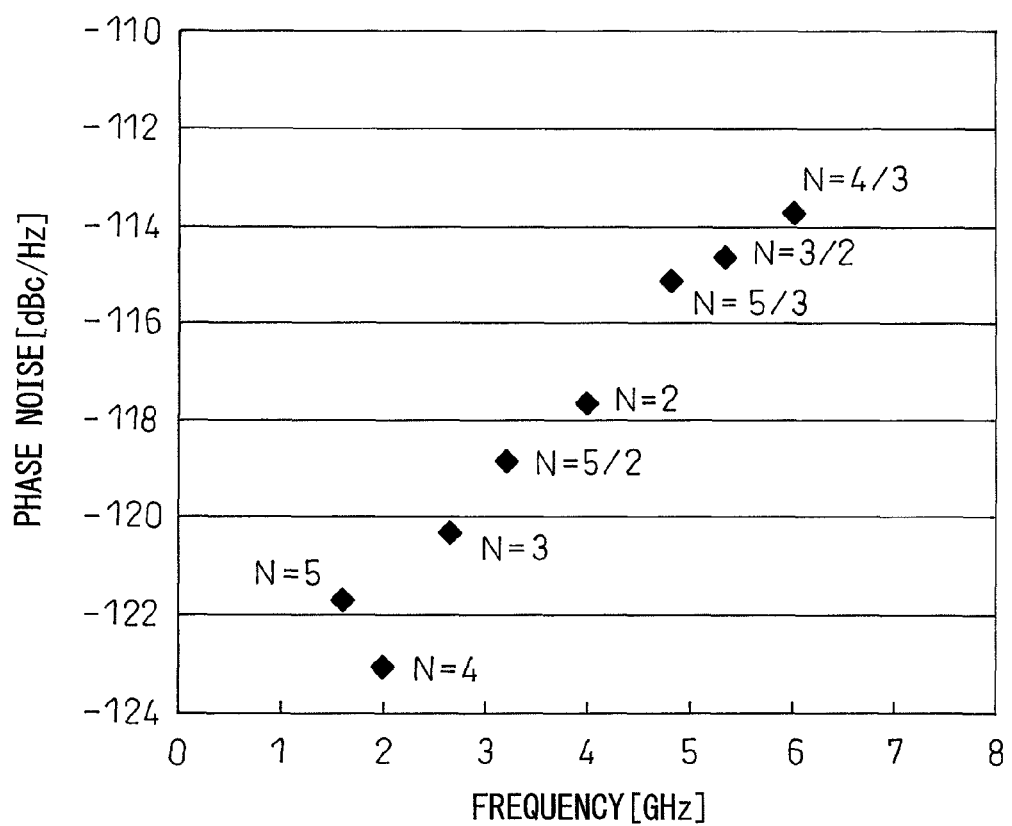
FIG. 13 is a graph representing phase noises of divided signals with the frequencies of the divided signals denoted on a horizontal axis in an embodiment.

FIG. 13 is a graph that represents the phase noise at the time of division by 4/3, division by 3/2, division by 5/3, division by 5/2, division by 2, division by 3, division by 4, division by 5 when the frequency of the oscillation signal is set to f0=8 GHz where the horizontal axis represents the frequency of the divided signal. As shown in FIG. 13, the higher the frequency, the higher the phase noise increases.

Figure 14:
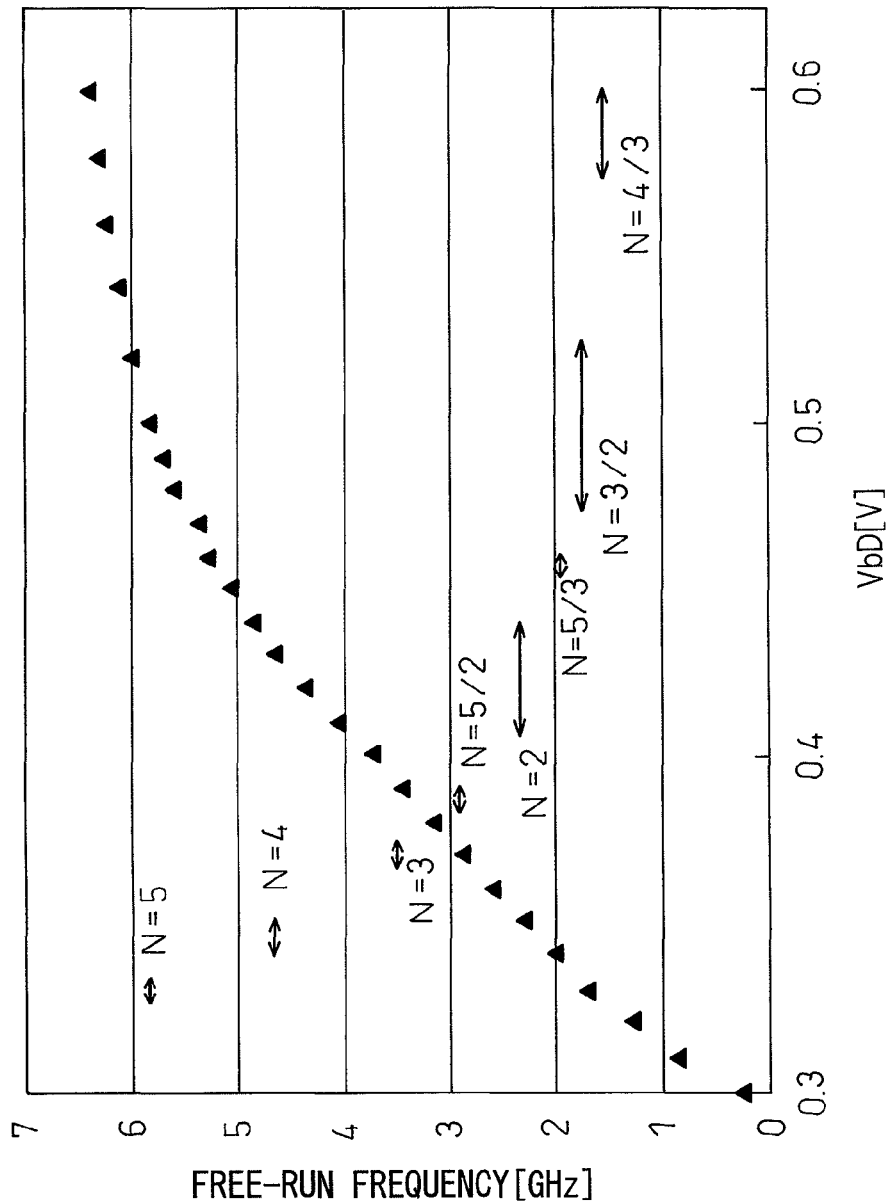
FIG. 14 is a diagram showing a relationship between the bias voltage VbD of a differential inverter of an ILFD and the free-run frequency.

FIG. 14 is a diagram showing a relationship between the bias voltage VbD of the differential inverter of the ILFD 12 output from the control part 13 and the free-run frequency of the ILFD 12. When the bias voltage VbD is increased, the free-run frequency of the ILFD 12 increases as denoted by triangles. Consequently, by setting the bias voltage VbD in accordance with the frequency of the divided signal generated by the ILFD 12, it is possible to make a division in a desired division ratio. The ranges of the bias voltage VbD when divisions are made in division ratios of 4/3, 3/2, 5/3, 2, 5/2, 3, 4, 5, i.e., the frequency ranges in which the oscillation of the ILFD 12 is locked, i.e., the lock ranges are denoted by arrows.

Figure 15:
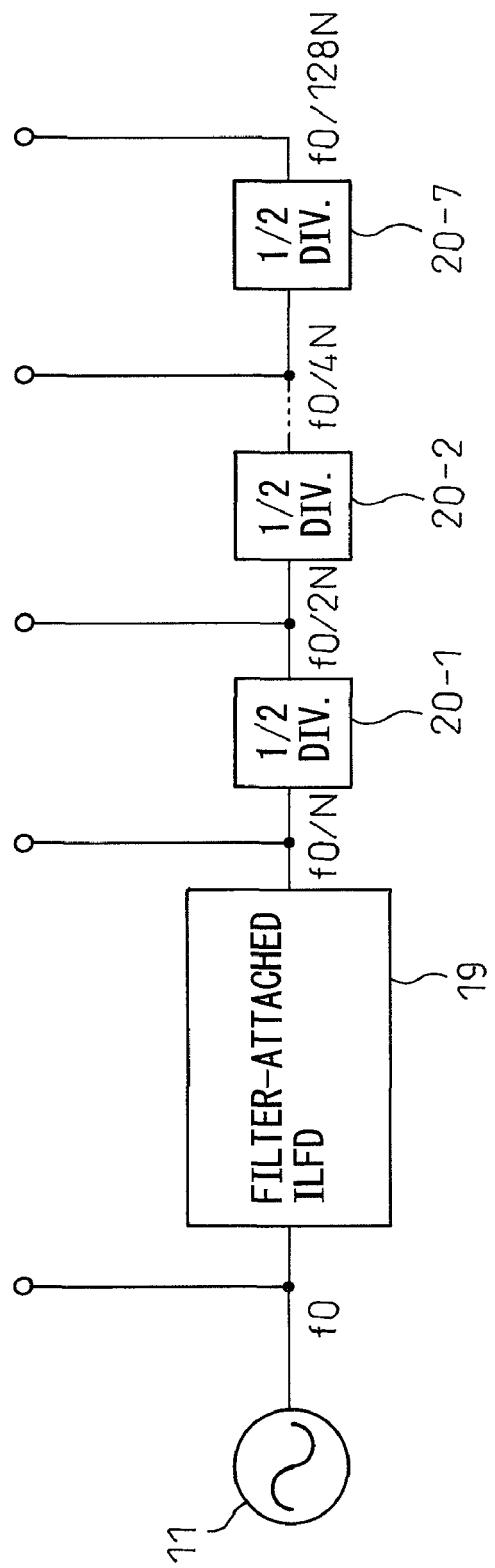
FIG. 15 is a diagram showing a configuration of an oscillation circuit that is made capable of obtaining a divided signal in a wider frequency range by connecting flip-flop circuits in series which further divide by 2 a divided signal output from the wideband oscillation circuit in an embodiment.

FIG. 15 is a diagram showing a configuration of an oscillation circuit in which obtaining a divided signal in a very wide frequency range by connecting flip-flop circuits in series that further divide by 2 the divided signal output from the wideband oscillation circuit in the embodiment is possible.

As shown in FIG. 15, this oscillation circuit comprises the LC type voltage control oscillator (VCO) 11, a filter-attached ILFD 19, and seven flip-flop circuits (FF) 20-1, 20-2, . . . , 20-7 connected in series so as to divide by 2 the divided signal sequentially output from the filter-attached ILFD 19. The filter-attached ILFD 19 includes the ILFD 12, the control part 13, and the filter 14 in the embodiment. In other words, this oscillation circuit is the wideband oscillation circuit in the embodiment, in which the seven flip-flop circuits (FF) 20-1, 20-2, . . . , 20- are connected in series.

The VCO 11 outputs the oscillation signal of the frequency f0 and the frequency can be varied in a predetermined range. This oscillation signal is output to a first output terminal as well as being supplied to the filter-attached ILFD 19.

The filter-attached ILFD 19 outputs a divided signal that is divided in a division ratio N appropriately set. The divided signal of the frequency f0/N is output to a second output terminal as well as being supplied to the FF 20-1.

The FF 20-1 divides by 2 the divided signal of the frequency f0/N and outputs a divided signal of a frequency f0/2N. This divided signal of the frequency f0/2N is output to a third output terminal as well as being supplied to the FF 20-2. Similarly, the FF 20-2 to 20-7 divide by 2 the divided signals supplied and output them to fourth to ninth output terminals as well as supplying them to the next stage.

If a selector that selects an oscillation (divided) signal output from the first to ninth output terminals is provided, it is possible to obtain an oscillation signal of a desired frequency.

Figure 16:
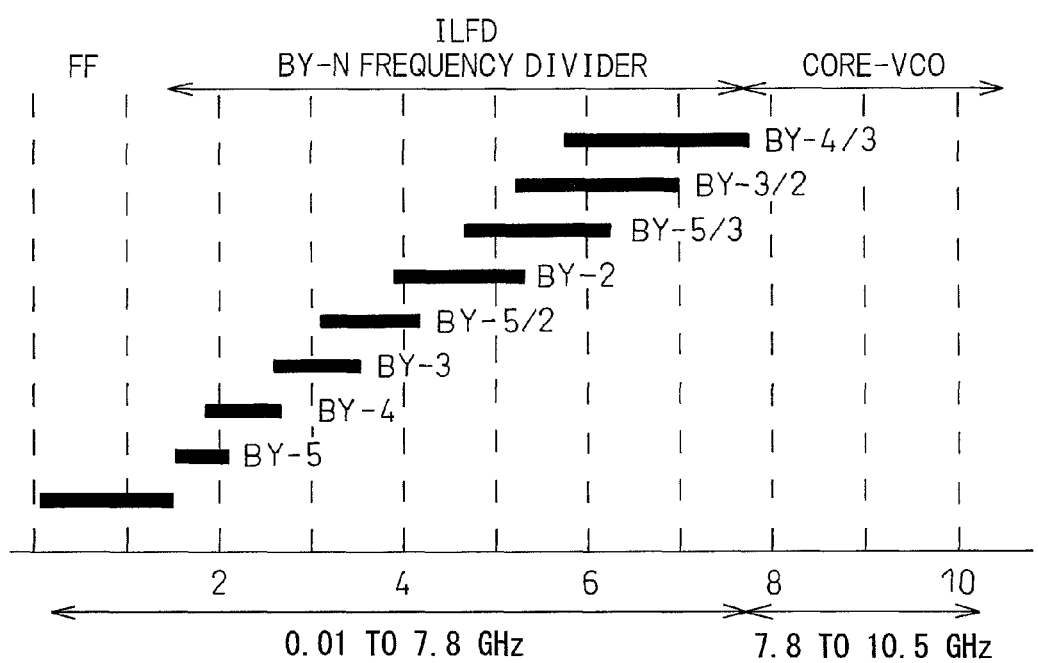
FIG. 16 is a diagram explaining a frequency range of an oscillation signal obtained by the oscillation circuit in FIG. 15.

FIG. 16 is a diagram for explaining the frequency range of the oscillation signal obtained by the oscillation circuit in FIG. 15.

As shown in FIG. 16, the VCO 11 has a variable frequency range of 7.8 GHz to 10.5 GHz.

The filter-attached ILFD 19 divides by 4/3, 3/2, 5/3, 2, 5/2, 3, 4, and 5 the oscillation signal output from the VCO 11 and outputs the divided signals in the frequency range of 15.6 GHz to 7.875 GHz. The range of each divided signal overlaps the range of the divided signal of the neighboring frequency, and therefore, it is possible to obtain the divided signals continuous in the frequency range of 1.56 GHz to 7.875 GHz.

The FF 20-1 to 20-7 divides the divided signal output from the filter-attached ILFD 19 and outputs an oscillation (divided) signal of a frequency equal to or less than 1.56 GHz. Divisions by up to $1/2^7$ are made, and therefore, it is possible to obtain an oscillation signal of a frequency of 12.3 MHz (0.01 GHz) as a minimum frequency.

Figure 17:
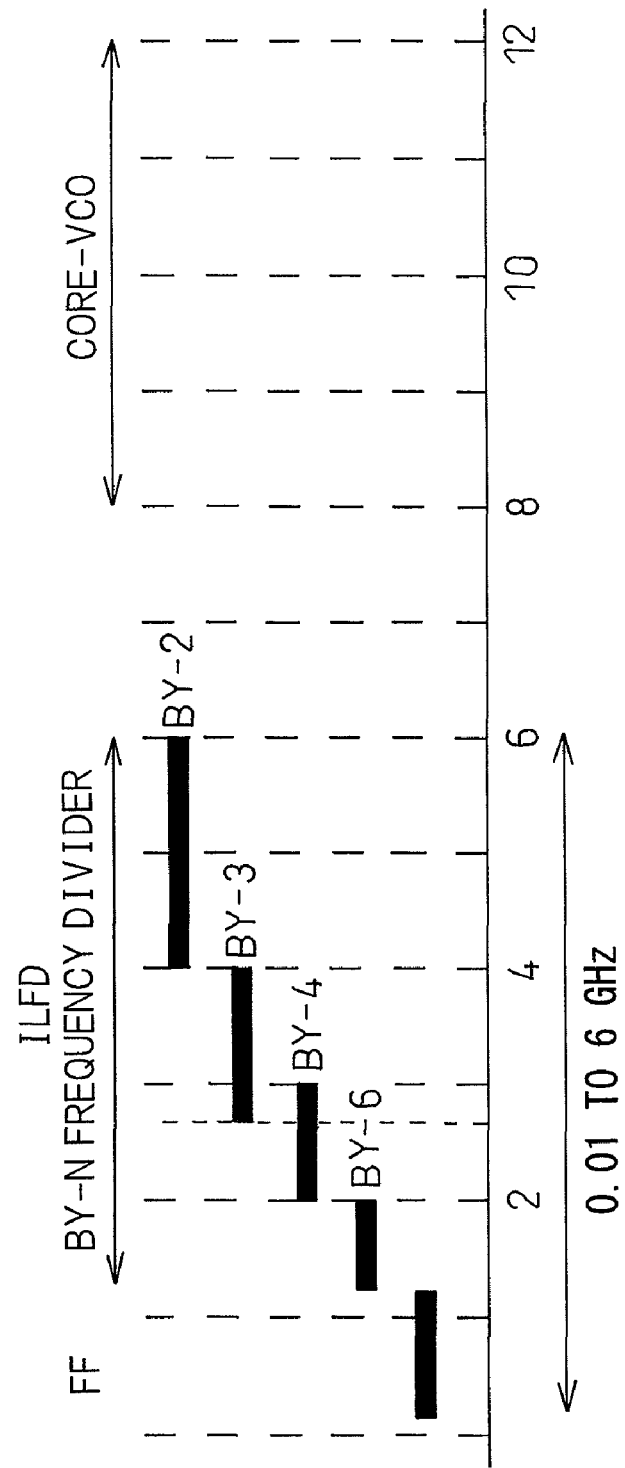
FIG. 17 is a diagram explaining a frequency range of an oscillation signal obtained by an oscillation circuit in a conventional example.

FIG. 17 is a diagram explaining frequency ranges of oscillation signals obtained by the oscillation signal described in JP2009-225438A and S. Hara, K. Okada and A. Matsuzawa, "A 9.3 MHz to 5.7 GHz Tunable LC-based VCO Using a Divide-by-N Injection-Locked Frequency Divider", IEEE A-SSCC, November 2009.

Compared to FIG. 16, different points are that the variable frequency range of VCO is as wide as 8 GHz to 12 GHz, that oscillation (divided) signals in the frequency range of 6 GHz to 8 GHz cannot be obtained, and that the frequency ranges of divided signals generated by the ILFD do not overlap partially.

It is possible to solve the problems of the oscillation circuit described in JP2009-225438A and S. Hara, K. Okada and A. Matsuzawa, "A 9.3 MHz to 5.7 GHz Tunable LC-based VCO Using a Divide-by-N Injection-Locked Frequency Divider", IEEE A-SSCC, November 2009, by utilizing the wideband oscillation circuit of the present invention.

In the embodiment described above, as filter control signals locked with divided signals to be supplied to the filter, any of the four-phase divided signals I+, I−, Q+, Q− generated by the ILFD 12 or a combination thereof is utilized, however, as long as being locked with the divided signal, other signals can be utilized as filter control signals.

Figure 18:
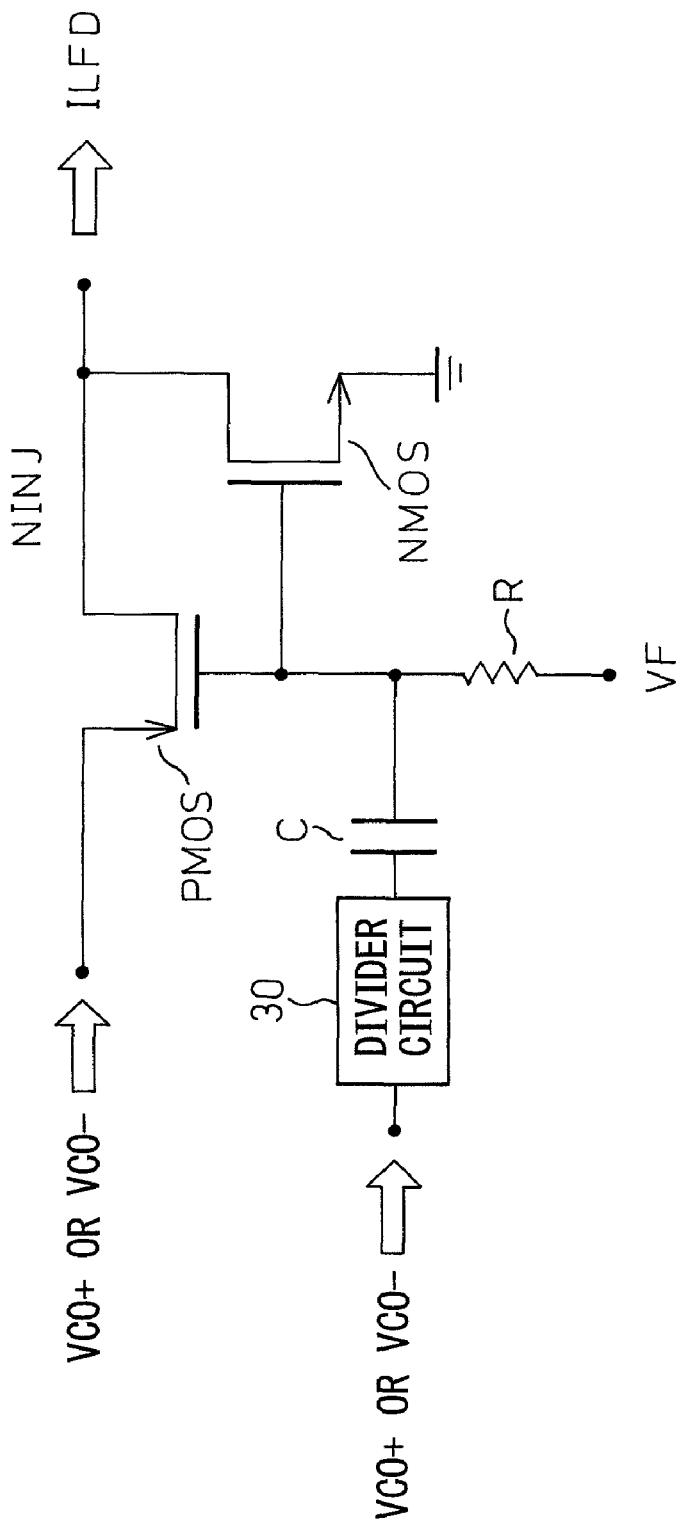
FIG. 18 is a diagram showing a configuration of a modified example of a filter that uses an oscillation signal as a filter control signal.

FIG. 18 is a diagram showing a configuration of a modified example of a filter that utilizes VCO+ or VCO− output from the VCO 11 as a filter control signal. This filter comprises a divider circuit 30 that divides VCO+ or VCO− in addition to the configuration in FIG. 8 and supplies the divided signal of VCO+ or VCO− to the capacitor C. The divided signal generated by the ILFD 12 is locked with VCO+ or VCO− output from the VCO 11, and therefore, it is possible to generate the injection locked signal NINJ.

It is also possible to use the wideband oscillation circuit as part of a PLL circuit. Further, it is also possible to use the LC type VCO of the wideband oscillation circuit of the present invention as part of a PLL circuit, as described in JP2009-225438A, and to use its output to generate a divided signal by inputting the output to the ILFD via the filter.

The embodiments of the present invention are described as above, however, the described embodiments are merely for explanation of the invention and it is possible for a person skilled in the art to easily understand that there can be various modified examples within the scope of claims. Several modified examples are shown schematically and explained below briefly.

Figure 19C:
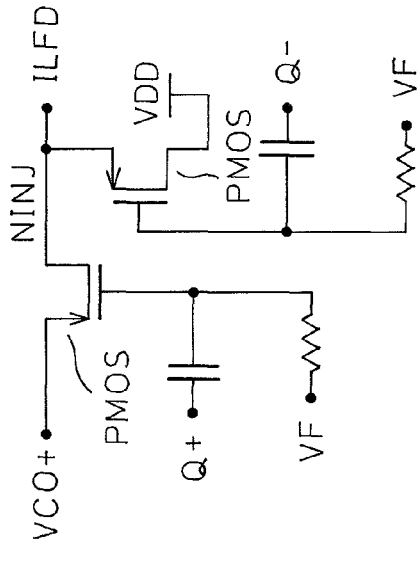
FIG. 19A to FIG. 19C are diagrams showing a configuration of a modified example of a filter.
Figure 19A:
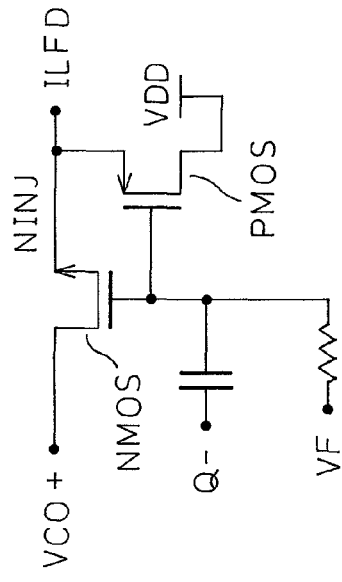
Figure 19B:
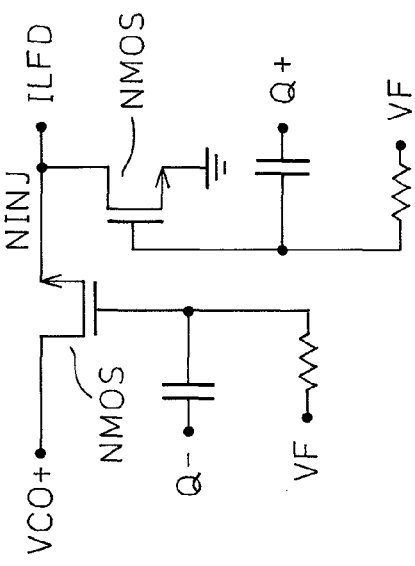

FIG. 19A to FIG. 19C are diagrams showing modified examples of the filter 14. FIG. 19A shows the filter in FIG. 8, in which the passing switch is replaced with an NMOS transistor and the connection switch with a PMOS transistor and one of the terminals of the PMOS transistor is connected to the high potential source VDD and to which the divided signal Q− is supplied.

FIG. 19B shows the filter in FIG. 8, in which the passing switch is replaced with an NMOS transistor and to the gate of the NMOS transistor, the divided signal Q− is supplied and to the gate of the PMOS transistor, the divided signal Q+ is supplied.

FIG. 19C shows the filter in FIG. 8, in which the connection switch is replaced with a PMOS transistor and one of the terminals of the PMOS transistor is connected to the high potential source VDD, to the gate of the NMOS transistor, the divided signal Q− is supplied, and to the gate of the PMOS transistor, the divided signal Q+ is supplied.

Figure 20A:
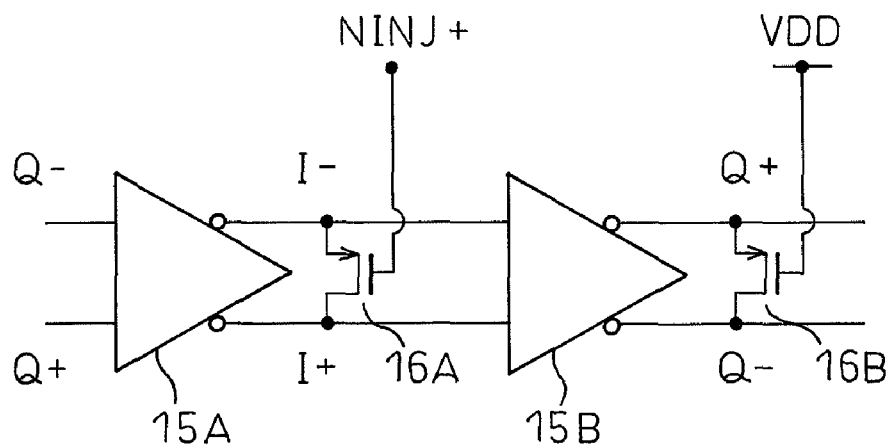
FIG. 20A and FIG. 20B are diagrams showing a configuration of a modified example of an ILFD.
Figure 20B:
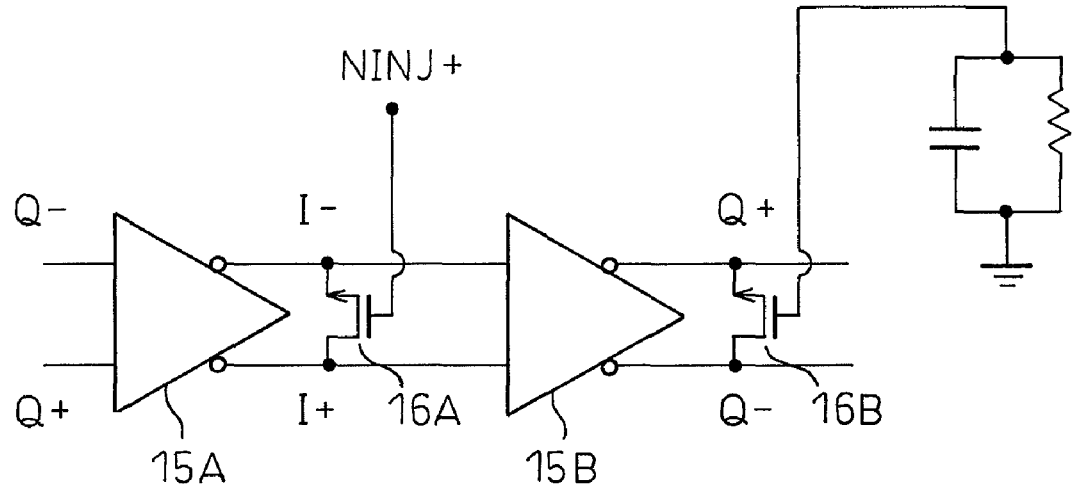

FIG. 20A and FIG. 20B are diagrams showing modified examples of parts to which the injection locked signal of the ILFD 12 is applied. FIG. 20A shows the ILFD 12 in FIG. 5, in which the NMOS transistors 16A and 16B are replaced with PMOS transistors and the gate of the PMOS transistor 16B is connected to the high potential source VDD. As the signal NINJ+ to be applied to the gate of the PMOS transistor 16A, for example, a signal generated in the filter 14, in which the connection transistor in FIG. 19A and FIG. 19C is the PMOS transistor. Generally, when an NMOS transistor is used as a transistor to short-circuit the output terminals of the differential inverter of the ILFD 12 or to connect them to a predetermined potential, it is desirable to use a signal generated in the filter 14, in which the connection transistor is an NMOS transistor, and when a PMOS transistor is used as a transistor to short-circuit (connect) the output terminals of the differential inverter of the ILFD 12 or to connect them to a predetermined potential, it is desirable to use a signal generated in the filter 14, in which the connection transistor is a PMOS transistor.

FIG. 20B shows the ILFD 12 in FIG. 5, in which the gate of the NMOS transistor 16B is connected to the ground via a circuit in which a resistor and a capacitor are connected in parallel. With this configuration, it is possible to match the impedances between the output terminals of the differential inverters 15A and 15B by appropriately setting the gate voltage of the NMOS transistor 16 to a predetermined level other than the ground level.

Figure 21:
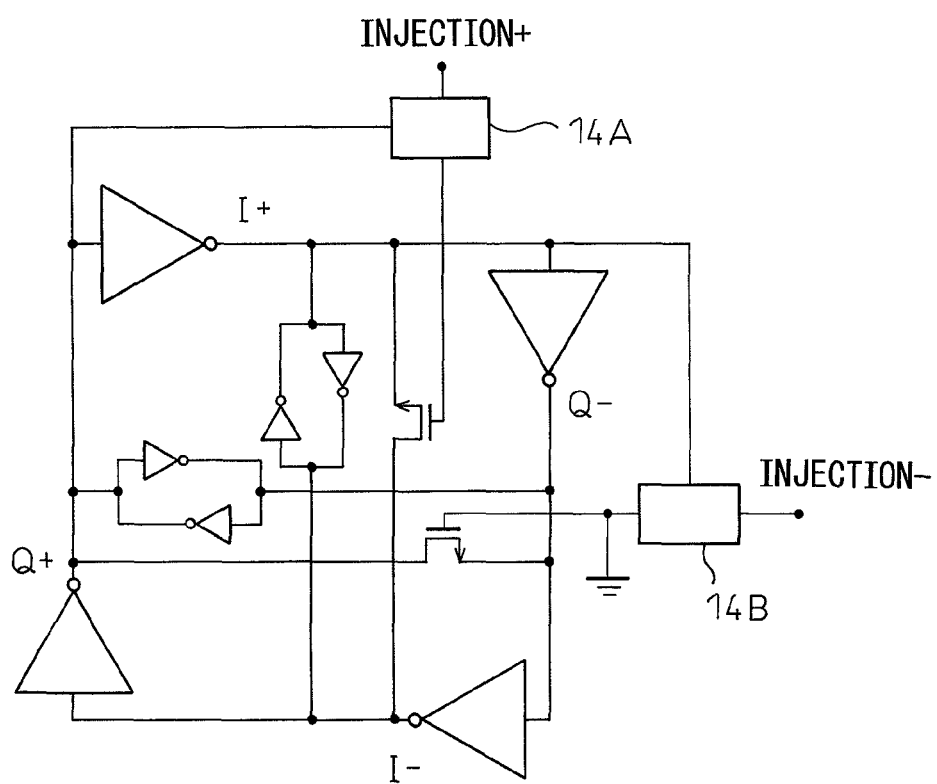
FIG. 21 is a diagram showing a circuit configuration of a modified example of an ILFD in an embodiment.

FIG. 21 is a circuit configuration of a modified example of the ILFD 12. While the ILFD 12 in FIG. 3 is a differential type ring oscillator having two differential inverters, the ILFD in FIG. 21 is a single end type ring oscillator. Two oscillation circuits in which two inverters are connected in the form of a ring are provided and by an injection charge signal in the opposite phase from the filters 14A and 14B, two NMOS transistors are brought into conduction and thus oscillation is controlled. More detailed explanation is omitted.

It is possible for a person skilled in the art to easily understand that there can also be a number of modified examples other than the embodiments and modified examples described above. Further, it is also possible for a person skilled in the art to easily understand that part of elements in the embodiments and modified examples described above can be replaced with elements in other examples.

The present invention can be applied to a wideband oscillation circuit that generates oscillation signals in a wide frequency range.

What is claimed is:

1. A wideband oscillation circuit comprising:
   an oscillator that outputs an oscillation signal;
   a filter that receives and filters the oscillation signal output from the oscillator and outputs an injection locked signal; and
   an injection locked frequency divider that performs a free-run operation and outputs a divided signal of the oscillation signal while the oscillating operation thereof is being controlled by the injection locked signal, the division ratio of which varies in accordance with a control signal, wherein:
   the injection locked frequency divider is a ring oscillator type having a differential two-stage configuration,
   the filter controls the passing characteristic that causes the oscillation signal to pass with respect to time in accordance with a filter control signal locked with the divided signal to generate the injection locked signal, and
   the filter control signal uses an output signal in one of the stages of the ring oscillator type injection locked frequency divider to connect an output in the other stage of the ring oscillator type injection locked frequency divider in accordance with the injection locked signal.

2. The wideband oscillation circuit according to claim 1, wherein
   the filter comprises:
      an input terminal to which the oscillation signal is input and an output terminal from which the injection locked signal is output;
      a passing switch that controls the passing characteristic that causes the oscillation signal to pass; and
      a connection switch that controls whether or not to connect the output terminal of the passing switch to a predetermined potential, and
   the passing switch enters a state where the passing switch suppresses the oscillation signal from passing and at the same time, the connection switch enters a connected state in accordance with the filter control signal.

3. The wideband oscillation circuit according to claim 2, wherein
   the passing switch and the connection switch are configured by two transistors and the divided signal output from the injection locked frequency divider is applied to gates of the two transistors.

4. The wideband oscillation circuit according to claim 2, wherein
   the passing switch and the connection switch are configured by two transistors and the gates of the two transistors are connected to a predetermined potential via a resistor and
   at the same time, the divided signal is applied via a capacitor.

* * * * *